United States Patent
Estabrooks et al.

(10) Patent No.: US 10,263,609 B2
(45) Date of Patent: Apr. 16, 2019

(54) OVEN CONTROLLED CRYSTAL OSCILLATOR DEVICE COVER

(71) Applicant: Ciena Corporation, Hanover, MD (US)

(72) Inventors: Kevin Estabrooks, Nepean (CA); Daniel Rivaud, Ottawa (CA); Adrianus Van Gaal, Ottawa (CA)

(73) Assignee: Ciena Corporation, Hanover, MD (US)

( * ) Notice: Subject to any disclaimer, the term of this patent is extended or adjusted under 35 U.S.C. 154(b) by 116 days.

(21) Appl. No.: 15/090,433

(22) Filed: Apr. 4, 2016

(65) Prior Publication Data

US 2017/0288678 A1 Oct. 5, 2017

(51) Int. Cl.
*H03K 7/08* (2006.01)
*H03L 1/02* (2006.01)
*H03L 1/04* (2006.01)

(52) U.S. Cl.
CPC .............. *H03K 7/08* (2013.01); *H03L 1/022* (2013.01); *H03L 1/04* (2013.01)

(58) Field of Classification Search
CPC .... H03H 9/0547; H03L 1/04; B23K 26/0066; H03K 7/08

USPC .......... 219/438, 121.79, 395, 385; 331/94.1, 331/158, 68, 69, 70, 176
See application file for complete search history.

(56) References Cited

U.S. PATENT DOCUMENTS

| | | | | |
|---|---|---|---|---|
| 2003/0197568 | A1* | 10/2003 | Satoh | H03B 5/04 331/158 |
| 2011/0186561 | A1* | 8/2011 | Ahmed | A47J 37/0709 219/438 |
| 2013/0270240 | A1* | 10/2013 | Kondo | B23K 26/0066 219/121.79 |

* cited by examiner

*Primary Examiner* — Arnold M Kinkead
(74) *Attorney, Agent, or Firm* — Clements Bernard Walker PLLC; Christopher L. Bernard; Lawrence A. Baratta, Jr.

(57) ABSTRACT

A device cover for temperature control of a component device includes at least one heating element enclosed using the device cover, and multiple sections. Each section is located at a distinct location on the device cover and includes a reflection angle for the distinct location. The reflection angle is configured to reflect heat to the component device enclosed using the device cover, the heat originating from the at least one heating element.

20 Claims, 5 Drawing Sheets

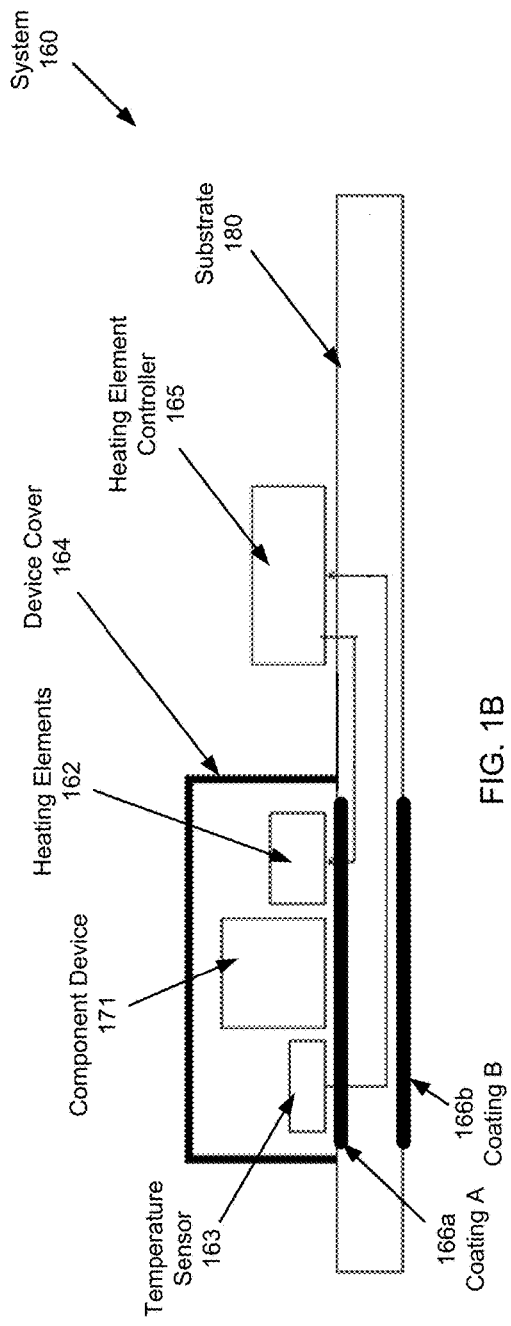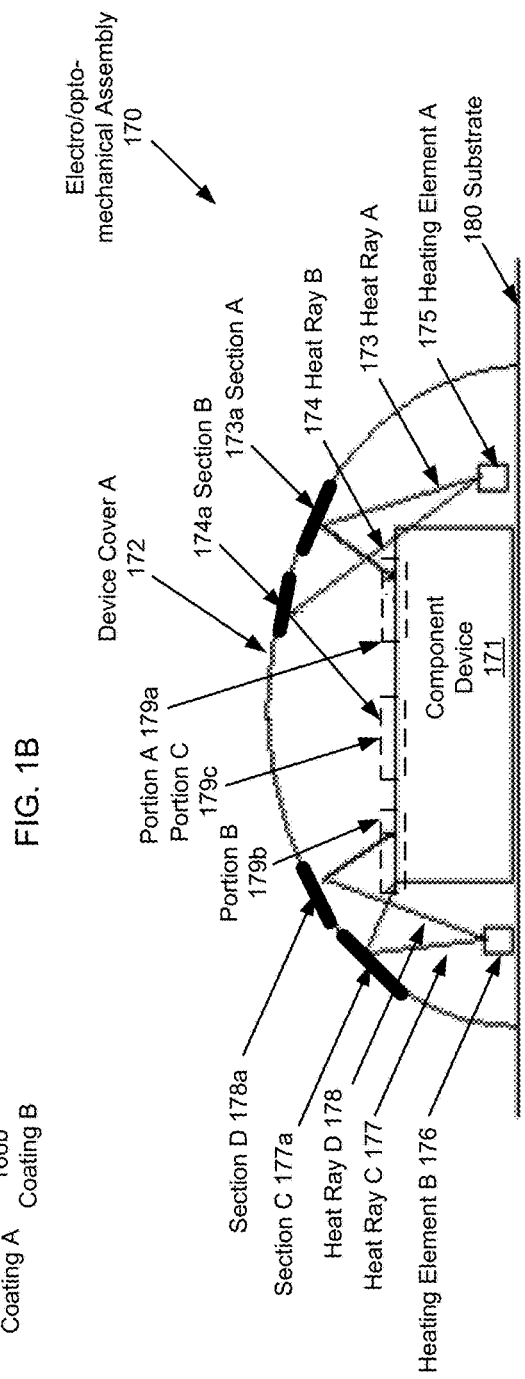

OVEN CONTROLLED CRYSTAL OSCILLATOR DEVICE COVER

BACKGROUND

Performance of certain classes of component devices is degraded by device temperature and/or changes in the device temperature. For example, the oscillating frequency of a crystal oscillator (XO) device or an oven controlled crystal oscillator (OCXO) device changes with temperature and may exceed a specified range required by a system application. As a result, manufacturers generally select a more expensive OCXO (e.g., constructed from Rubidium) to operate over outdoor temperature ranges (e.g., −40° C. to +65° C.). Alternatively, manufacturers may add a cover to the XO or OCXO for thermal insulation. However, a typical cover (e.g., a square or rectangular box) does not substantially reduce radiated heat loss. Although existing XO or OCXO covers may offer performance improvement, they do not bring performance to the same operating range of higher end OCXO devices designed to operate in cold outdoor environments.

SUMMARY

In general, in one aspect, one or more embodiments of the invention relates to a device cover for temperature control of a component device. The device cover includes at least one heating element enclosed using the device cover, and multiple sections. Each section is located at a distinct location on the device cover and includes a reflection angle for the distinct location. The reflection angle is configured to reflect heat to the component device enclosed using the device cover, the heat originating from the at least one heating element.

In general, in one aspect, one or more embodiments of the invention relates to an electro/opto-mechanical assembly for temperature control of a component device. The electro/opto-mechanical assembly includes at least one heating element in proximity of the component device, and a device cover having multiple sections. Each section is located at a distinct location on the device cover and includes a reflection angle for the distinct location. The reflection angle is configured to reflect heat to the component device enclosed using the device cover. The heat originates from the at least one heating element enclosed using the device cover.

In general, in one aspect, one or more embodiments of the invention relates to a method for temperature control of a component device. The method includes providing a device cover having multiple sections. Each section is located at a distinct location on the device cover and includes a reflection angle for the distinct location. The reflection angle is configured to reflect heat to the component device enclosed using the device cover. The heat originates from at least one heating element enclosed using the device cover. The method further includes mounting, on a substrate, the device cover, the component device, and the at least one heating element.

Other aspects of the invention will be apparent from the following description and the appended claims.

BRIEF DESCRIPTION OF DRAWINGS

FIG. 1B shows a schematic diagram of a system in accordance with one or more embodiments of the invention.

FIG. 1C shows a schematic diagram of a device cover and associated electro/opto-mechanical assembly in accordance with one or more embodiments of the invention.

DETAILED DESCRIPTION

Figure 1A:
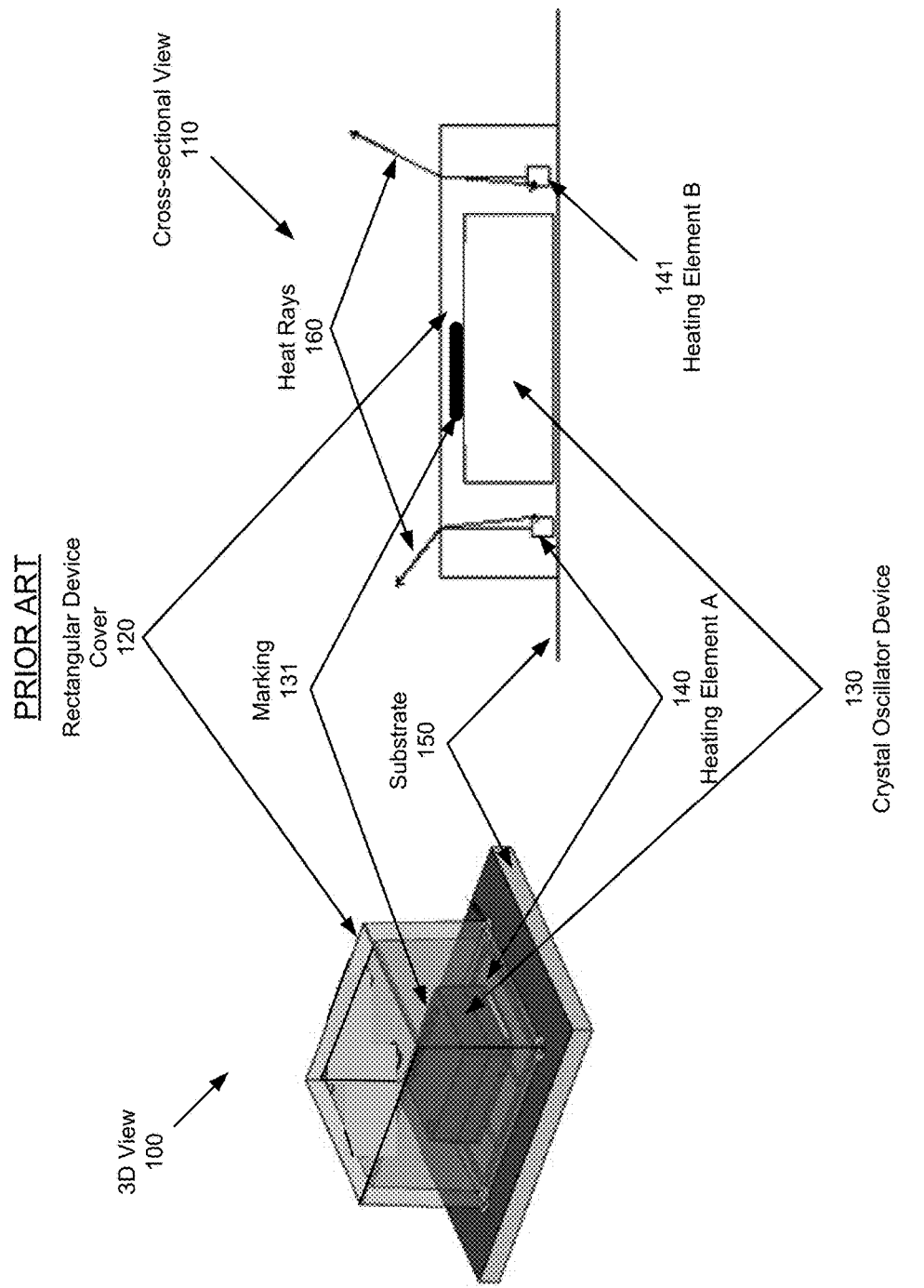
FIG. 1A shows a schematic diagram of a prior art OCXO device.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide device cover and a method for temperature control of a component device. In one or more embodiments of the invention, the device cover is used to enclose the component device and at least one heating element. Each section located at a distinct location on the device cover has a reflection angle for the distinct location. The reflection angle is configured to reflect heat originating from the at least one heating element to the component device. In one or more embodiments, the device cover and the device are mounted on a substrate to form an oven around the component device. Accordingly, the temperature of the component device is kept substantially constant despite ambient temperature fluctuation. In one or more embodiments, the device cover includes a reflective-coated and parabolic-shaped portion that evenly directs heat radiation from heating resistors toward the component device. In one or more embodiments, one or more selective material zones are defined on the surface of the component device that are matched to one or more reflector focal points of the parabolic-shaped portion of the device cover. In one or more embodiments, the component device is an OCXO device.

FIG. 1A shows a schematic diagram of a prior art OCXO device. Specifically, FIG. 1A shows a three dimensional (3D) view (100) and a cross-sectional view (110) of an XO device (130) with associated heating elements (e.g., heating element A (140), heating element B (141)). As shown in FIG. 1A, the XO device (130), heating element A (140), and heating element B (141) are enclosed by a rectangular device cover (120) over a substrate (150). The XO device (130) has one or more surface markings (e.g., marking (131)) that may be heat-reflective or heat-absorptive depending on the material composition of the surface markings. When the OCXO device is incorporated in a system that is powered, the heating elements (e.g., heating element A (140), heating element B (141)) generate heat to keep the XO device (130) at a target temperature. However, the temperature of the XO device (130) may deviate from the target temperature due to heat loss through the rectangular device cover (120) influenced by ambient temperature fluctuation. For example, the heat loss may include radiated heat loss such as caused by the heat rays (160) originating from the heating element A (140) and heating element B (141). As used herein, a heat ray is a directed thermal radiation from a heat source. In particular, the heat ray is radiated thermal energy that travels through space along a particular direction and may be reflected upon hitting a surface. The heat ray may be represented as an open arrow or a zig/zagged open arrow in the drawings.

FIG. 1B shows a system (160) in accordance with one or more embodiments. In one or more embodiments, one or more of the modules and elements shown in FIG. 1B may be omitted, repeated, and/or substituted. Accordingly, embodiments of the invention should not be considered limited to the specific arrangements of modules shown in FIG. 1B.

As shown in FIG. 1B, the system (160) includes a component device (171), heating elements (162), and a temperature sensor (163) that are enclosed by a device cover (164) over a substrate (180) where various components of the system (160) are mounted. For example, the components may be mounted using through-hole and/or surface mount soldering techniques. In one or more embodiments of the invention, the component device (171) is a constructed device that is used as a component in a system, such as a computing system, a communication system, a network system, or other electronic and/or optical system. For example, the component device (171) may be an electronic device and/or an optical device, such as a XO, OCXO, semi-conductor memory device, optoelectronic device, electro-optical device, or other type of temperature sensitive device. The heating elements (162) are one or more heat sources that generate heat in a controlled manner. In one or more embodiments, the sole function of the heating elements (162) is to generate a variable amount of heat to keep the component device (171) at a target temperature. For example, the heating elements (162) may be one or more resistors that generate an amount of heat that is proportional to an applied voltage. The substrate (180) is a sheet of material providing mechanical support and electrical and/or optical connection for devices mounted onto the substrate (180). For example, the substrate (180) may be a printed circuit board, or other type of supporting/connecting mechanism. The device cover (164) is an item with an open end to enclose other item(s) in conjunction with a separate end piece, such as the substrate (180). In one or more embodiments, the device cover (164) is constructed using suitable material, such as metal, alloy, plastic, fiber glass, carbon fiber, etc.

In one or more embodiments of the invention, the device cover (164) and the substrate (180) form an oven enclosing the component device (171) and the heating elements (162) to reduce convective heat transfer and radiated heat transfer away from the component device (171). In addition, a heating element controller (165) couples with the heating elements (162) and the temperature sensor (163) to control the temperature of the component device (171). For example, the temperature sensor (163) may be in contact with or in proximity of the component device (171) and generate a temperature signal that represents the temperature of the component device (171). In other words, the temperature signal is a signal that identifies the temperature of the component device (171). The temperature signal is received by the heating element controller (165). The heating element controller (165) includes the functionality to control the heating element (162). In part, the heating element controller (165) includes the functionality to generate a heating signal to adjust the heating elements (162). For example, the heating signal may be a pulse width modulation (PWM) signal that directly powers the heating elements (162) or indirectly controls the power supplied to the heating elements (162). In particular, a duty cycle of the PWM signal is adjusted by the heating element controller (165) based on the temperature signal.

In one or more embodiments of the invention, a portion of the substrate (180) (e.g., covered by the device cover (164) and acting as part of the oven interior surface) is coated with a low-emissivity material (e.g., nickel plating) coating A (166a) to decrease radiation losses through the substrate (180). In addition, the other side of the substrate (180) may also be coated with a low-emissivity material coating B (166b) to reduce radiation to the ambient environment.

Although only a limited number of components are described with respect to the system (160), the system (160) may include additional components for performing functionality of the system (160).

FIG. 1C shows a schematic diagram of a device cover A (172) and associated electro/opto-mechanical assembly (170) in accordance with one or more embodiments of the invention. In one or more embodiments, one or more of the modules and elements shown in FIG. 1C may be omitted, repeated, and/or substituted. Accordingly, embodiments of the invention should not be considered limited to the specific arrangements of modules shown in FIG. 1C.

As shown in FIG. 1C, the device cover A (172), component device (171), heating element A (175), heating element B (176), and substrate (180) collectively form an electro/opto-mechanical assembly (170). As used herein, the electro/opto-mechanical assembly refers to a collection of electronic and/or optical components interconnected into a mechanically stable item for performing a pre-determined electronic, optical, and/or mechanical function. In one or more embodiments of the invention, the electro/opto-mechanical assembly (170) may be a portion of the system (160) described in reference to FIG. 1B above. For example, the component device (171) depicted in FIG. 1B and FIG. 1C is the same device. The device cover A (172), heating element A (175), and heating element B (176) are examples of the device cover (164) and heating elements (162) depicted in FIG. 1B above. In addition, the electro/opto-mechanical assembly (170) may also include a temperature sensor, which is not explicitly shown in FIG. 1C.

In one or more embodiments of the invention, the device cover A (172) has a curved shape that includes multiple sections where each section may be approximated as flat, sloped, or other shape. For example, the device cover A (172) may have a substantially parabolic shape that includes multiple sections, such as a section A (173a), section B (174a), section C (177a), section D (178a), etc. In particular, each of the section A (173a), section B (174a), section C (177a), section D (178a), etc. is located at a distinct location on the device cover A (172). Based on the curved shape, each section is oriented at a reflection angle, relative to a heating element (e.g., heating element A (175), heating element B (176)), for the distinct location.

In one or more embodiments, the reflection angle is configured to reflect heat to the component device (171) from at least one heating element (e.g., heating element A (175), heating element B (176)) enclosed using the device cover A (172). In particular, an incidence angle is formed between the orientation of a section of the curved shape and a heat ray from a heating element reaching the section. The incidence angle depends on the distinct location of the section and the fixed mounting position of the heating element. In addition, a reflection angle is formed between the orientation of the section and the reflected heat ray from the section towards the component device (171). For the reflected heat ray to reach the component device (171) from the section, the reflection angle depends on the distinct location of the section and the fixed mounting position of the component device (171). Base on physics principles, the reflection angle equals the incidence angle. In other words, the configuration of the reflection angle is, in part, based on the fixed mounting positions of the at least one heating element (e.g., heating element A (175), heating element B (176)), the device cover A (172), and the component device (171) on the substrate (180). For example, the section A (173a) reflects a heat ray A (173) originating from the heating element A (175) to a portion A (179a) of the component device (171). The section B (174a) reflects a heat ray B (174) originating from the heating element A (175) to the portion C (179c) of the component device (171). Similarly, the section C (177a) reflects a heat ray C (177) originating from the heating element B (176) to a portion B (179b) of the component device (171). The section D (178a) reflects a heat ray D (178) originating from the heating element B (176) to the portion B (179b) of the component device (171). Based on the varying reflection angles of the sections of the device cover A (172), the interior surface of the device cover A (172) is shaped to reflect thermal radiations from the heating element A (175) and heating element B (176) towards various portions of the component device (171). As used herein, "interior surface" refers to the side of the device cover A (172) facing the component device (171) and the substrate (180). Considering the interior surface of the device cover A (172) as a mirror, different portions of the component device (171) would always "see" an image of either the heating element A (175) or heating element B (176). In other words, as many locations of the component device (180) as possible receive a heat ray from at least one heating element to maintain a near constant temperature around all exposed surface of the component device (180).

In one or more embodiments of the invention, all or a portion of the exposed surface of the component device (180) is coated with a thermally selective material, such as nickel plating or other low-emissivity thermally reflective coating material. In one or more embodiments, the exterior surface (i.e., opposite the component device) of the device cover A (172) also has a low-emissivity coating to reduce radiation losses to the ambient environment.

In one or more embodiments, the thermally selective material has a high absorptivity and a low emissivity simultaneously. In other words, the thermally selective material absorbs thermal energy easily, but doesn't emit thermal energy easily. Example value of absorptivity of the thermally selective material may be around 0.9. Example value of emissivity of the thermally selective material may be around 0.9. Additional examples of thermally selective material include copper with a layer of black cupric oxide, black chromium (i.e., nickel-plated copper), steel plated with gold, silicon, and silicon dioxide. The thermally selective material exists as paints and coatings and is used in industrial applications. The thermally selective material coating on the component device (171) minimizes the number of internal reflections and thus ensures that most of the radiated thermal energy stays in the component device (171).

In one or more embodiments, the thermally selective material coating allows particular selective zones to be created on the surface of the component device (171) as the target locations for the parabolic reflector focal points of the device cover A (172). For example, the portion A (179a) and portion B (179b) of the component device (171) may be coated with the thermally selective material and located around two focal points of the parabolic shape of the device cover A (172). In one or more embodiments, the shape of the device cover A (172) and/or the relative position of the component device (171) with respect to the device cover A (172) are adjusted to divert or block heat rays from hitting a particular low absorptivity and/or high emissivity region (i.e., avoided surface region) on the surface of the component device (171). For example, the avoided surface region may have a commercial marking that has a thermally non-absorptive material.

Although an example of the device cover A (172) is described above as having a parabolic shape, in one or more embodiments, the interior of the device cover A (172) may have multiple parabolic shapes to improve the even distribution of the thermal radiation over the entire extent of the component device (171). Accordingly, thermal gradients across the component device (171) are reduced to prevent performance degradation.

Figure 2:
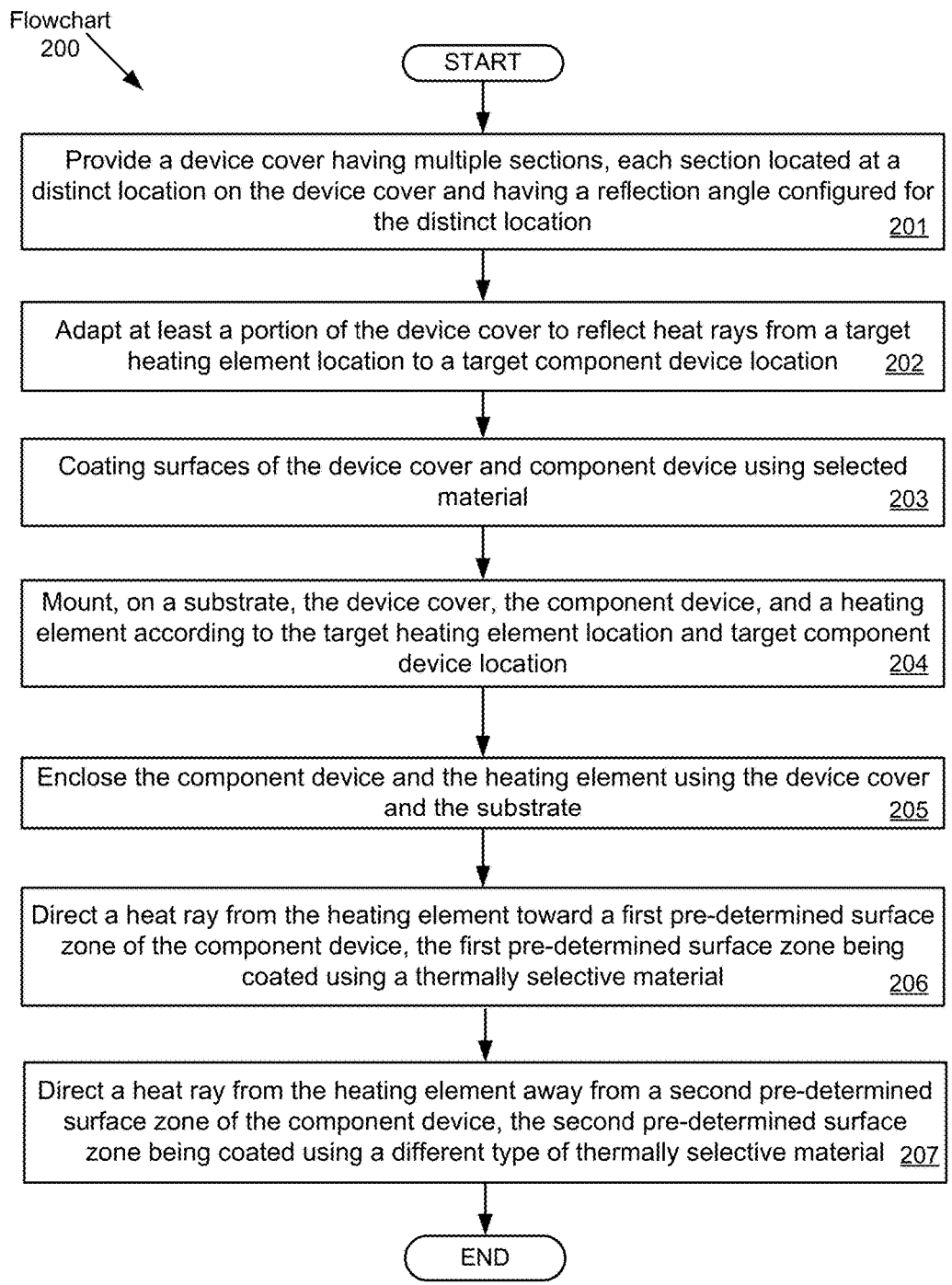
FIG. 2 shows a flowchart in accordance with one or more embodiments of the invention.

FIG. 2 shows a flowchart (200) in accordance with one or more embodiments. The process depicted in FIG. 2 may be used to design, manufacture, and/or assemble a device cover and/or associated electro/opto-mechanical assembly. The process shown in FIG. 2 may be performed based on the device cover and/or associated electro/opto-mechanical assembly discussed above in reference to FIGS. 1B and 1C. One or more steps shown in FIG. 2 may be omitted, repeated, and/or performed in a different order among different embodiments of the invention. Accordingly, embodiments of the invention should not be considered limited to the specific number and arrangement of steps shown in FIG. 2.

Initially, in Step 201, a device cover having multiple sections is provided where each section is located at a distinct location on the device cover. In one or more embodiments of the invention, each section has a reflection angle for the corresponding distinct location. In one or more embodiments of the invention, the reflection angle of each section of the device cover is formed using a molding or forming technique to create a permanent (i.e., mechanically stable) shape of the device cover. In one or more embodiments, the device cover includes at least one curved portion.

In Step 202, at least a portion of the device cover is adapted to reflect heat rays from a first target location for a heating element (i.e., target heating element location) to a second target location for a component device (i.e., target component device location). In one or more embodiments of the invention, the target heating element location and the target component device location are pre-determined relative to the device cover and, more specifically, to the shape of the device cover. In one or more embodiments, the reflection angle of each section of the device cover is configured to reflect heat from the target heating element location to the target component device location. In one or more embodiments, the device cover has multiple curved portions for reflecting heat from multiple target heating element locations to the target component device location. For example, the reflection angle of each section in a first portion of the device cover may be configured to reflect a first set of heat rays from a first heating element to the component device. Similarly, the reflection angle of each section in a second portion of the device cover may be configured to reflect a second set of heat rays from a second heating element to the component device.

In Step 203, the surfaces of the device cover and component device are coated using selected material. In one or more embodiments of the invention, a pre-determined surface region on the component device is coated using a coating material. For example, a marking surface region may be coated using a marking ink to print a commercial label on the component device. The marking ink may have low thermal absorptivity and high thermal emmisivity. In another example, a component device surface region at a focal point of the device cover may be coated with high thermal absorptivity and low thermal emmisivity material (i.e., the aforementioned thermally selective material). In yet another example, the exterior surface of the device cover may be coated using low thermal emmisivity material.

In Step 204, the device cover, the component device, and one or more heating elements are mounted on a substrate. In one or more embodiments of the invention, the mounting is performed using a through-hole or surface mount soldering technique to create a permanent (i.e., mechanically stable) relative position between each of the device cover, the component device, and one or more heating elements. In one or more embodiments, the component device and one or more heating elements are mounted on the substrate according to the target component device location and target heating element location(s) relative to the device cover. In one or more embodiments, the target component device location may overlap or coincide with a focal point of the device cover having a parabolic shape.

In Step 205, the component device and the one or more heating elements are enclosed using the device cover and the substrate. In one or more embodiments of the invention, the device cover and the substrate form an oven surrounding the component device and the one or more heating elements to reduce convective heat transfer and radiated heat transfer away from the component device.

In Step 206, a heat ray is directed from a heating element toward a pre-determined surface region of the component device where the pre-determined surface region is coated with the aforementioned thermally selective material. In one or more embodiments of the invention, the heat ray is directed toward the pre-determined surface region based on the reflection angles in at least a portion of the device cover.

In Step 207, a heat ray is directed from a heating element away from an avoided surface region on the component device where the avoided surface region is coated with a thermally non-absorptive material, such as the marking ink. In one or more embodiments of the invention, the heat ray is directed away from the avoided surface region based on the reflection angles in at least a portion of the device cover.

In one or more embodiments, a particular portion of the device cover is disposed at a position relative to the component device such that any heat ray along a trace from the heating element to any point on the particular portion of the device cover is captured by the component device before reaching the particular portion of the device cover. In other words, the heating element is located in a shadow of the component device casted by the particular portion of the device cover over the substrate.

Figure 3A:
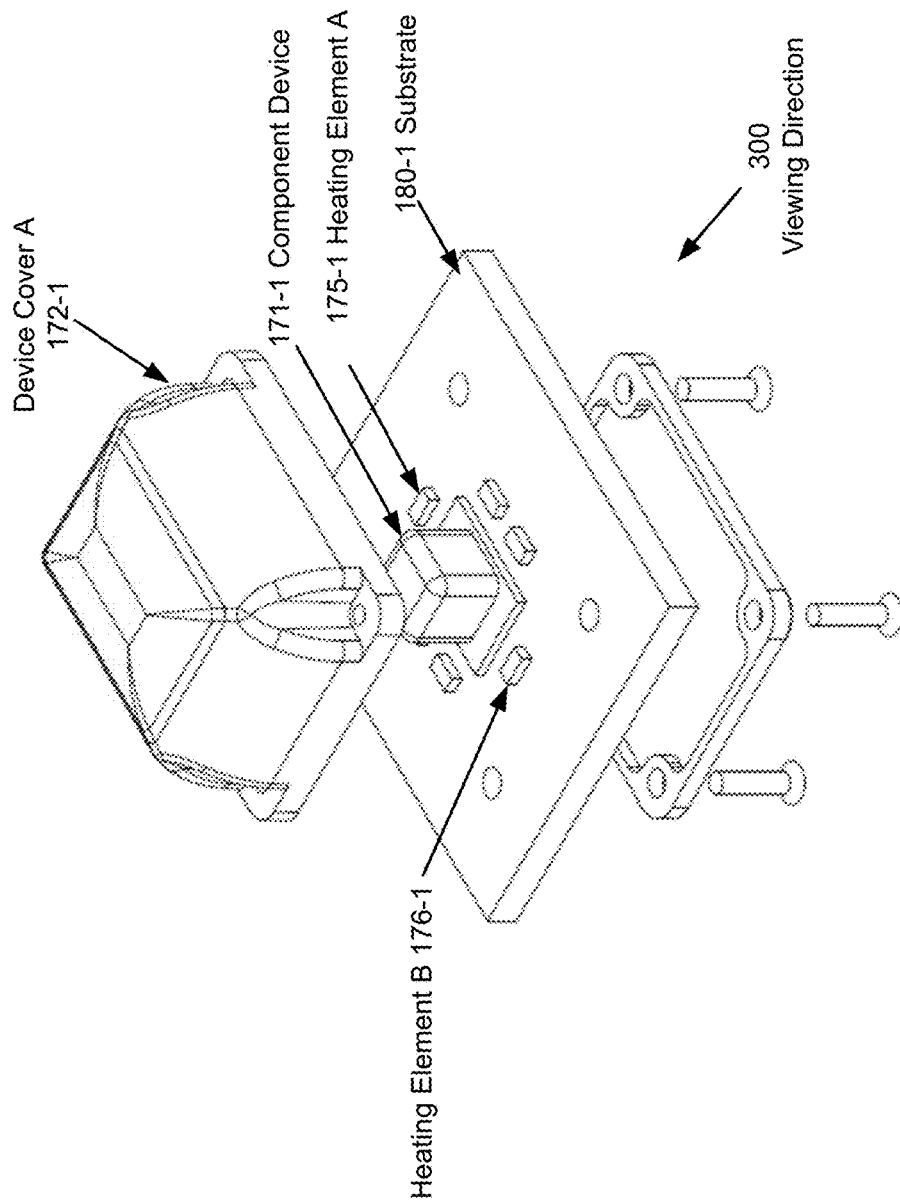
FIGS. 3A, 3B, and 3C show an example in accordance with one or more embodiments of the invention.
Figure 3B:
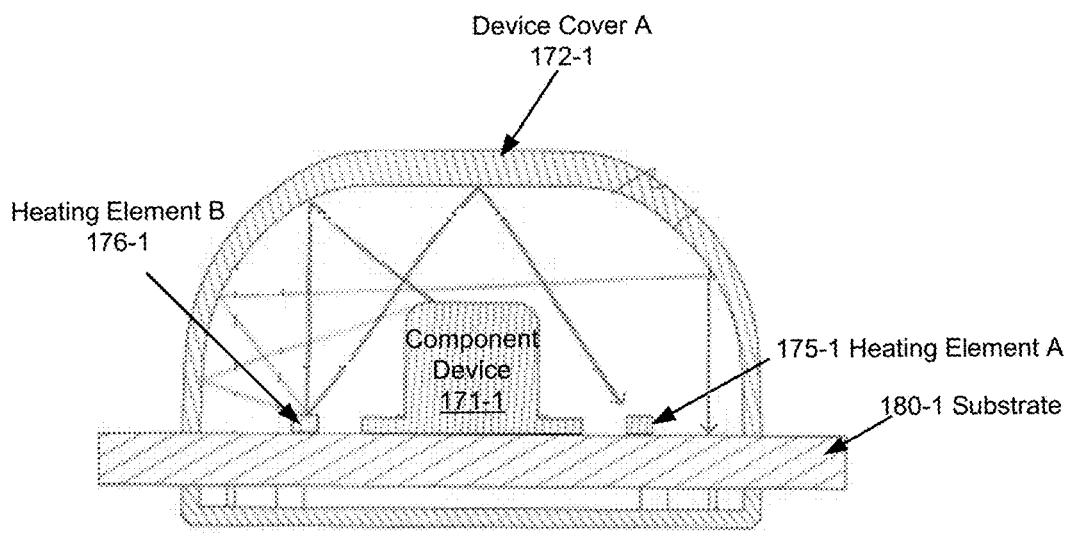
Figure 3C:
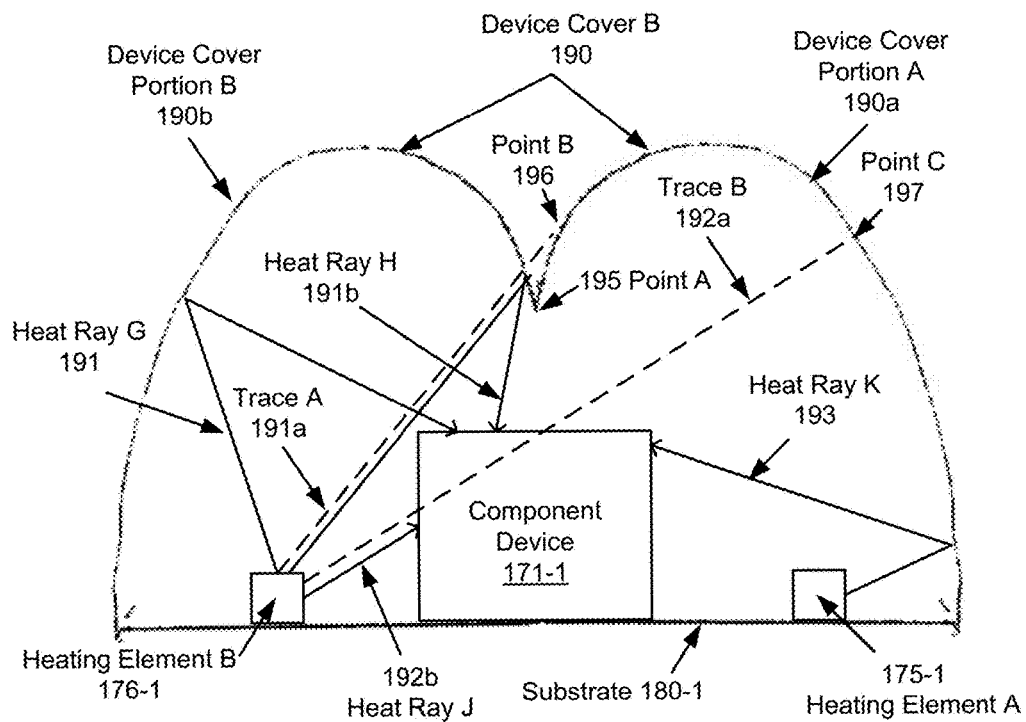

FIGS. 3A, 3B, and 3C show an example in accordance with one or more embodiments of the invention. The example shown in FIGS. 3A, 3B, and 3C may be practiced using the device cover and method flow chart discussed in reference to FIG. 1B, FIG. 1C, and FIG. 2 above. In particular, the device cover A (172-1), component device (171-1), heating element A (175-1), heating element B (176-1), and substrate (180-1) depicted in FIGS. 3A, 3B, and 3C are examples of the like-named components depicted in FIG. 1C above. In one or more embodiments, one or more of the modules and elements shown in FIGS. 3A-3C may be omitted, repeated, and/or substituted. Accordingly, embodiments of the invention should not be considered limited to the specific arrangements of modules shown in FIGS. 3A-3C.

FIG. 3A shows an example 3D view of the electro/opto-mechanical assembly (170) depicted in FIG. 1C above. For example, the schematic diagram depicted in FIG. 1C of the electro/opto-mechanical assembly (170) may correspond to a cross sectional view from the viewing direction (300) shown in FIG. 3A.

FIG. 3B shows the cross sectional view from the viewing direction (300) shown in FIG. 3A. In particular, the cross sectional view corresponds to the schematic diagram depicted in FIG. 1C of the electro/opto-mechanical assembly (170). Example heat rays are depicted as various arrows in FIG. 3B. A different version of the device cover A (172-1) is shown in FIG. 3C as the device cover B (190).

FIG. 3C shows a schematic diagram of the device cover B (190) in accordance with one or more embodiments of the invention. In particular, the device cover B (190) includes two substantially parabolic shaped portions adjoined at the point A (195). Specifically, the device cover portion A (190a) is adapted to reflect heat rays (e.g., heat ray K (193)) from the heating element A (175-1) to the component device (171-1) while the device cover portion B (190b) is adapted to reflect heat rays (e.g., heat ray G (191)) from the heating element B (176-1) to the component device (171-1). In one or more embodiments of the invention, the device cover portion A (190a) is disposed at a relative position to the component device (171-1) such that any heat ray (e.g., heat ray H (191b), heat ray J (192b)) along a trace (e.g., trace A (191a), trace B (192a)) from the heating element B (176-1) to any point (e.g., point B (196), point C (197)) on the device cover portion A (190a) is captured by the component device (171-1) before reaching the device cover portion A (190a). In other words, the heating element B (176-1) is located in a shadow of the component device (171-1) casted by the device cover portion A (190a) over the substrate (180-1).

Similarly, the device cover portion B (190b) may also be disposed at a relative position to the component device (171-1) such that any heat ray along a trace from the heating element A (175-1) to any point on the device cover portion B (190b) is captured by the component device (171-1) before reaching the device cover portion B (190b). In other words, the heating element A (175-1) is located in a shadow of the component device (171-1) casted by the device cover portion B (190b) over the substrate (180-1).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A device cover for temperature control of a component device, comprising:
   at least one heating element enclosed using the device cover; and
   a plurality of sections, each section of the plurality of sections located at a distinct location on the device cover and comprising a reflection angle for the distinct location, the reflection angle being configured to reflect heat to the component device enclosed using the device cover, the heat originating from the at least one heating element,
   wherein the device cover, the component device, and the at least one heating element are mounted on a single side of a substrate,
   wherein the at least one heating element comprises a first heating element and a second heating element, wherein the plurality of sections comprises a first portion of the device cover that is adapted to reflect a first plurality of heat rays from the heating element to the component device and a second portion of the device cover that is adapted to reflect a second plurality of heat rays from the second heating element to the component device, and wherein the second portion of the device cover is disposed at a relative position to the component device such that any heat ray along a trace from the first heating element to any point on the second portion of the device cover is captured by the component device before reaching the second portion of the device cover.

2. The device cover of claim 1, the plurality of sections configured to:

enclose, in conjunction with the substrate configured to mount the component device and the at least one heating element, the component device and the at least one heating element, wherein enclosing the component device reduces convective heat transfer and radiated heat transfer away from the component device.

3. The device cover of claim 2, wherein the device cover is mounted on the substrate and comprises a parabolic-shaped portion.

4. The device cover of claim 1, wherein reflecting heat to the component device comprises:

directing a heat ray from the least one heating element toward a pre-determined surface region of the component device, wherein the pre-determined surface region is coated with a thermally selective material.

5. The device cover of claim 1, wherein reflecting heat to the component device comprises:

directing a heat ray from the least one heating element away from a pre-determined surface region of the component device, wherein the pre-determined surface region is coated with a thermally non-absorptive material.

6. An electro/opto-mechanical assembly for temperature control of a component device, comprising:

at least one heating element in proximity of the component device; and a device cover having a plurality of sections, each section of the plurality of sections located at a distinct location on the device cover and comprising a reflection angle for the distinct location, the reflection angle being configured to reflect heat to the component device enclosed using the device cover, the heat originating from the at least one heating element enclosed using the device cover, wherein the device cover, the component device, and the at least one heating element are mounted on a single side of a substrate, wherein the at least one heating element comprises a first heating element and a second heating element, wherein the plurality of sections comprises a first portion of the device cover that is adapted to reflect a first plurality of heat rays from the heating element to the component device and a second portion of the device cover that is adapted to reflect a second plurality of heat rays from the second heating element to the component device, and wherein the second portion of the device cover is disposed at a relative position to the component device such that any heat ray along a trace from the first heating element to any point on the second portion of the device cover is captured by the component device before reaching the second portion of the device cover.

7. The electro/opto-mechanical assembly of claim 6, further comprising:

the substrate configured to mount the component device and the at least one heating element, wherein the plurality of sections is further configured to enclose, in conjunction with the substrate, the component device and the at least one heating element, and wherein enclosing the component device reduces convective heat transfer and radiated heat transfer away from the component device.

8. The electro/opto-mechanical assembly of claim 7, wherein the device cover is mounted on the substrate and comprises a parabolic-shaped portion.

9. The electro/opto-mechanical assembly of claim 6, wherein reflecting heat to the component device comprises:

directing a heat ray from the least one heating element toward a pre-determined surface region of the component device, wherein the pre-determined surface region is coated with a thermally selective material.

10. The electro/opto-mechanical assembly of claim 6, wherein reflecting heat to the component device comprises:

directing a heat ray from the least one heating element away from a pre-determined surface region of the component device, wherein the pre-determined surface region is coated with a thermally non-absorptive material.

11. A method for temperature control of a component device, comprising:

providing a device cover having a plurality of sections, each section of the plurality of sections located at a distinct location on the device cover and comprising a reflection angle for the distinct location, the reflection angle being configured to reflect heat to the component device enclosed using the device cover, the heat originating from at least one heating element enclosed using the device cover; and mounting, on a single side of a substrate, the device cover, the component device, and the at least one heating element, wherein the at least one heating element comprises a first heating element and a second heating element, wherein the plurality of sections comprises a first portion of the device cover that is adapted to reflect a first plurality of heat rays from the heating element to the component device and a second portion of the device cover that is adapted to reflect a second plurality of heat rays from the second heating element to the component device, and wherein the second portion of the device cover is disposed at a relative position to the component device such that any heat ray along a trace from the first heating element to any point on the second portion of the device cover is captured by the component device before reaching the second portion of the device cover.

12. The method of claim 11, further comprising:

enclosing, using the device cover and the substrate, the component device and the at least one heating element, wherein enclosing the component device reduces convective heat transfer and radiated heat transfer away from the component device.

13. The method of claim 11, wherein reflecting heat to the component device comprises:

directing a heat ray from the least one heating element toward a pre-determined surface region of the component device, wherein the pre-determined surface region is coated with a thermally selective material.

14. The method of claim 11, wherein reflecting heat to the component device comprises:

directing a heat ray from the least one heating element away from a pre-determined surface region of the component device, wherein the pre-determined surface region is coated with a thermally non-absorptive material.

15. The device cover of claim 1, wherein a portion of the substrate is adapted to reflect a second plurality of heat rays from the heating element to the component device.

16. The electro/opto-mechanical assembly of claim 6, wherein a portion of the substrate is adapted to reflect a second plurality of heat rays from the heating element to the component device.

17. The method of claim 11, wherein a portion of the substrate is adapted to reflect a second plurality of heat rays from the heating element to the component device.

18. The device cover of claim 15, wherein the substrate is a printed circuit board, and wherein the portion of the substrate is coated with a thermally non-absorptive material adapted to reflect the second plurality of heat rays from the heating element to the component device.

19. The electro/opto-mechanical assembly of claim 16, wherein the substrate is a printed circuit board, and wherein the portion of the substrate is coated with a thermally non-absorptive material adapted to reflect the second plurality of heat rays from the heating element to the component device.

20. The method of claim 17, wherein the substrate is a printed circuit board, and wherein the portion of the substrate is coated with a thermally non-absorptive material adapted to reflect the second plurality of heat rays from the heating element to the component device.

\* \* \* \* \*